United States Patent
Heo et al.

(10) Patent No.: US 9,252,198 B2
(45) Date of Patent: Feb. 2, 2016

(54) ORGANIC LIGHT EMITTING DISPLAY DEVICE WITH REDUCED GENERATION OF PARASITIC CAPACITANCE AND METHOD FOR MANUFACTURING THE SAME

(75) Inventors: Seong-Kweon Heo, Yongin (KR); Ki-Nyeng Kang, Yongin (KR)

(73) Assignee: Samsung Display Co., Ltd. (KR)

( * ) Notice: Subject to any disclaimer, the term of this patent is extended or adjusted under 35 U.S.C. 154(b) by 686 days.

(21) Appl. No.: 13/366,685

(22) Filed: Feb. 6, 2012

(65) Prior Publication Data

US 2013/0044095 A1 Feb. 21, 2013

(30) Foreign Application Priority Data

Aug. 18, 2011 (KR) .................. 10-2011-0082257

(51) Int. Cl.
*H01J 63/04* (2006.01)
*H01L 27/32* (2006.01)
(52) U.S. Cl.
CPC .................................. *H01L 27/3276* (2013.01)
(58) Field of Classification Search
CPC .................................................. H01L 27/3276
USPC ......................................................... 313/504
See application file for complete search history.

(56) References Cited

U.S. PATENT DOCUMENTS

2006/0082293 A1* 4/2006 Kang et al. .................... 313/506

FOREIGN PATENT DOCUMENTS

| KR | 1020090041871 | 4/2009 |
| KR | 1020090068505 | 6/2009 |

* cited by examiner

*Primary Examiner* — Anh Mai
*Assistant Examiner* — Hana Featherly
(74) *Attorney, Agent, or Firm* — Knobbe Martens Olson & Bear LLP

(57) ABSTRACT

An organic light emitting diode (OLED) display includes: a substrate; a first and a second thin film transistor (TFT) both disposed on the substrate and both having an active layer, a gate, a source and a drain electrode. A gate line is connected to the gate electrode of the first TFT, and a data line is connected to the source electrode of the first TFT. A common power source line is connected to the source electrode of the second TFT, intersects the gate line, and is parallel to the data line. A pixel electrode is connected to the drain electrode of the second TFT. An organic emission layer is disposed on the first electrode. A common electrode line is disposed on the organic emission layer. A secondary common power source line is formed with the same material as and is parallel to the common electrode line.

14 Claims, 8 Drawing Sheets

ORGANIC LIGHT EMITTING DISPLAY DEVICE WITH REDUCED GENERATION OF PARASITIC CAPACITANCE AND METHOD FOR MANUFACTURING THE SAME

CROSS-REFERENCE TO RELATED APPLICATIONS

This application claims priority to and the benefit of Korean Patent Application No. 10-2011-0082257 filed in the Korean Intellectual Property Office on Aug. 18, 2011, the entire contents of which are incorporated herein by reference.

BACKGROUND

1. Field

The present disclosure relates generally to an organic light emitting diode (OLED) display and a manufacturing method thereof. More particularly, the described technology relates generally to an organic light emitting diode (OLED) display with minimized generation of unnecessary parasitic capacitance, and a manufacturing method thereof.

2. Description of the Related Technology

Organic light emitting diode (OLED) displays have garnered much attention as a next-generation display because of their merits such as wide viewing angle, fast response rate, and relatively less power consumption, as well as a lower weight and a slim size.

An organic light emitting diode (OLED) display generally includes a thin film transistor and a capacitor, as well as an organic light emitting element. A cathode of the organic light emitting element is deposited on the whole surface such that the cathode overlaps the capacitor.

Accordingly, an unnecessary parasitic capacitance is generated between an electrode of the capacitor and the cathode.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One embodiment provides an organic light emitting diode (OLED) display with minimized unnecessary parasitic capacitance.

An organic light emitting diode (OLED) display with a suppressed voltage drop is also provided.

Further, a manufacturing method of the above organic light emitting diode (OLED) displays is provided.

According to an one embodiment, an organic light emitting diode (OLED) display includes: a substrate; a first thin film transistor and a second thin film transistor disposed on the substrate and having an active layer, a gate electrode, a source electrode, and a drain electrode; a gate line connected to the gate electrode of the first thin film transistor; a data line connected to the source electrode of the first thin film transistor and intersecting the gate line; a common power source line connected to the source electrode of the second thin film transistor, intersecting the gate line, and being parallel to the data line; a pixel electrode connected to the drain electrode of the second thin film transistor and being isolated; an organic emission layer disposed on the first electrode; a common electrode line disposed on the organic emission layer and parallel to the data line and the common power source line; and a secondary common power source line formed with the same material as and parallel to the common electrode line on the common power source line.

The organic light emitting diode (OLED) display can further include a capacitor disposed in a space between the common electrode line and the secondary common power source line.

The capacitor can include: a first capacitor electrode formed with the same layer as the active layer of the first thin film transistor and the second thin film transistor and connected to the drain electrode of the first thin film transistor and the gate electrode of the second thin film transistor; and a second capacitor electrode formed with the same layer as the pixel electrode and the gate electrode and connected to the source electrode of the second thin film transistor and the common power source line.

In the organic light emitting diode (OLED) display, the secondary common power source line can be formed directly on the common power source line.

The organic light emitting diode (OLED) display can further include a protecting insulating layer disposed between the secondary common power source line and the common power source line.

According to another embodiment, an organic light emitting diode (OLED) display includes: a substrate; a semiconductor layer pattern disposed on the substrate and including an active layer and a first capacitor electrode; a gate insulating layer disposed on the semiconductor layer pattern; a first conductive layer pattern disposed on the gate insulating layer and including a gate line, a pixel electrode, a gate electrode, and a second capacitor electrode; an interlayer insulating layer disposed on the first conductive layer pattern and having a pixel interlayer opening region exposing a portion of the pixel electrode; a second conductive layer pattern including a source electrode, a drain electrode, a data line, and a common power source line disposed on the interlayer insulating layer; a protecting insulating layer disposed on the second conductive layer pattern and having a pixel protecting opening region exposing a portion of the pixel electrode; a pixel defining layer disposed on the protecting insulating layer and having a pixel opening exposing a portion of the pixel electrode along with the pixel interlayer opening region and the pixel protecting opening region, and a line opening disposed on the common power source line; an organic emission layer disposed on the pixel electrode exposed through the pixel opening of the pixel defining layer; a common electrode line disposed on the organic emission layer and not overlapping a first capacitor electrode and a second capacitor electrode; and a secondary common power source line formed according to the common power source line in the line opening of the pixel defining layer.

The secondary common power source line can be disposed on the common power source line via the protecting insulating layer.

The protecting insulating layer can further include a line opening region exposing the common power source line along with the line opening of the pixel defining layer.

The secondary common power source line can be formed directly on the common power source line.

In the organic light emitting diode (OLED) display, the common electrode line can intersect the gate line and may be parallel to the data line and the common power source line.

According to another embodiment, a manufacturing method of an organic light emitting diode (OLED) display includes: providing a substrate; forming a semiconductor layer pattern including an active layer and a first capacitor electrode on the substrate; forming a gate insulating layer on the semiconductor layer pattern; forming a first conductive layer pattern including a gate line, a pixel electrode, a gate electrode, and a second capacitor electrode on the gate electrode; forming an interlayer insulating layer having a pixel interlayer opening region exposing a portion of the pixel electrode on the first conductive layer pattern; forming a second conductive layer pattern including a source electrode, a drain electrode, a data line, and a common power source line on the interlayer insulating layer; forming a protecting insulating layer having a pixel protecting opening region exposing a portion of the pixel electrode along with the pixel interlayer opening region on the second conductive layer pattern; forming a pixel defining layer having a pixel opening exposing a portion of the pixel electrode along with the pixel interlayer opening region and the pixel protecting opening region, and a line opening formed on the common power source line on the protecting insulating layer; forming an organic emission layer on the pixel electrode exposed through the pixel opening of the pixel defining layer; forming a common electrode line that does not overlap a first capacitor electrode and a second capacitor electrode on the organic emission layer; and forming a secondary common power source line according to the common power source line in the line opening of the pixel defining layer.

The secondary common power source line can be formed on the common power source line via the protecting insulating layer.

The protecting insulating layer can further include a line opening region exposing the common power source line along with the line opening of the pixel defining layer.

The secondary common power source line can be formed directly on the common power source line.

In the manufacturing method of the organic light emitting diode (OLED) display, the common electrode line can intersect the gate line and can be parallel to the data line and the common power source line.

According to some embodiments, the organic light emitting diode (OLED) display can have minimized generation of unnecessary parasitic capacitance.

Also, the organic light emitting diode (OLED) display can have a suppressed voltage drop.

Further, the organic light emitting diode (OLED) display can be effectively manufactured.

DETAILED DESCRIPTION OF CERTAIN INVENTIVE EMBODIMENTS

Figure 1:
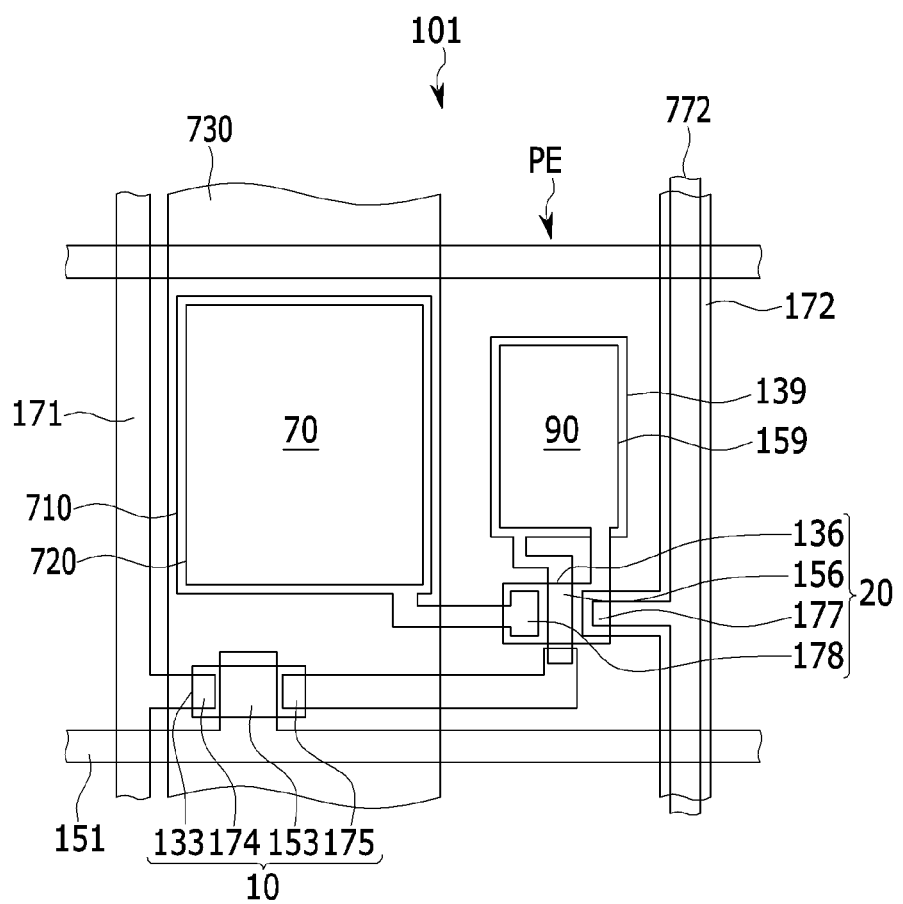
FIG. 1 is a layout view of a pixel area of an embodiment of an organic light emitting diode (OLED) display.

The present invention will be described more fully hereinafter with reference to the accompanying drawings, in which certain embodiments of the invention are shown. As those skilled in the art would realize, the described embodiments may be modified in various ways, without departing from the spirit or scope of the present invention.

Like reference numerals generally designate like elements throughout the specification. Further, only elements other than those described with respect to the first embodiment will be described in subsequently described embodiments.

The drawings are schematic and not proportionally scaled. Relative scales and ratios in the drawings may be enlarged or reduced for the purpose of accuracy and convenience, and the scales are random and not limited thereto. In addition, like reference numerals designate like structures, elements, or parts throughout the specification. It will be understood that when an element is referred to as being "on" another element, it can be directly on another element or intervening elements may be present therebetween.

Depicted embodiments views represent certain embodiments in detail. Various modifications of diagrams may be expected. Accordingly, embodiments are not limited to specific shapes of shown regions, and for example, also include modifications of the shape by manufacturing.

An embodiment of an organic light emission display device 101 will be described with reference to FIG. 1 and FIG. 2.

As shown in FIG. 1, an embodiment of an organic light emitting diode (OLED) display 101 has a 2Tr-1Cap structure with an organic light emitting diode 70, two thin film transistors (TFTs) 10 and 20, and a capacitor 90 for each pixel area PE. The pixel area PE refers to a region occupied by a pixel as a minimum unit displaying an image. In other embodiments, the display device 101 can be an OLED display having a structure in which at least three thin film transistors and at least two capacitors are arranged in each pixel area PE. The display device 101 can include additional connecting lines such that the display device 101 can have various structures. At least one of additionally formed thin film transistors and capacitors can construct a compensation circuit.

The compensation circuit improves uniformity of the OLEDs 70 formed in the pixel areas PE so as to suppress image quality deviation. The compensation circuit can include two to eight thin film transistors.

In some embodiments, the organic light emitting diode (OLED) display 101 includes a first thin film transistor 10 and a second thin film transistor 20 formed in each pixel area PE. The first thin film transistor 10 and the second thin film transistor 20 respectively include gate electrodes 153 and 156, active layers 133 and 136, source electrodes 174 and 177, and drain electrodes 175 and 178.

Also, a gate line 151, a data line 171, and a common power source line 172 are formed on a substrate 110. One pixel area PE can be defined by a gate line 151, a data line 171, and a common power source line 172. However, the pixel area PE is not limited thereto. Also, although not shown, a capacitor line may be additionally formed on the substrate 110.

The data line 171 is connected to the source electrode 174 of the first thin film transistor 10 and the gate line 151 is connected to the gate electrode 153 of the first thin film transistor 10. A node is formed between the drain electrode 175 of the first thin film transistor 10 and the capacitor 90 such that the drain electrode 175 of the first thin film transistor 10 is connected to a first capacitor electrode 139 of the capacitor 90. Also, a second capacitor electrode 159 is connected to the common power source line 172. Further, the drain electrode 175 of the first thin film transistor 10 is connected to the gate electrode 156 of the second thin film transistor 20. The source electrode 177 of the second thin film transistor 20 is connected to the common power source line 172, and the drain electrode 178 is connected to an anode of the organic light emitting element 70.

The organic light emitting element 70 includes an anode as a hole injection electrode, a cathode as an electron injection electrode, and an organic emission layer 720 disposed between the anode and the cathode. In other embodiments, according to the driving method, the anode and the cathode of the organic light emitting element may be exchanged. In the embodiment of FIG. 1, the anode is referred to as a pixel electrode 710 and the cathode is referred to as a common electrode line 730. In the embodiment of FIG. 1, the common electrode line 730 is formed with a stripe pattern. Also, the pixel electrode 710 can be formed with an isolated patterned.

The first thin film transistor 10 is used as a switch for selecting a pixel area PE to be light-emitted. If the first thin film transistor 10 is instantly turned on, the capacitor 90 is charged and the charged charge amount is proportional to the potential of the voltage applied from the data line 171. In a state that the first thin film transistor 10 is turned off, the gate potential of the second thin film transistor 20 is increased according to the potential charged to the capacitor 90. Also, if the gate potential is over a threshold voltage, the second thin film transistor 20 is turned on. Thus, the voltage applied to the common power source line 172 is applied to the organic light emitting element 70 through the second thin film transistor 20, and thereby the organic light emitting element 70 emits light.

In other embodiments, the constitution of the pixel PE is not limited to as above-described, but may be variously modified.

As shown in FIG. 1, the gate line 151 is formed in a direction intersecting the data line 171 and the common power source line 172. The data line 171 and the common power source line 172 are parallel to each other. In addition, the common electrode line 730 of the organic light emitting element 70 intersects the gate line 151, and is parallel to the data line 171 and the common power source line 172.

In the embodiment of FIG. 1, the capacitor 90 is disposed to not overlap the common electrode line 730 of the organic light emitting element 70. That is, the capacitor 90 is disposed at a space between the common electrode line 730 and the common power source line 172.

The organic light emitting diode (OLED) display 101 embodiment of FIG. 1 further includes a secondary common power source line 772 formed with the same material as and parallel to the common electrode line 730 on the common power source line 172. In the embodiment of FIG. 1, the secondary common power source line 772 is formed directly on the common power source line 172, as shown in FIG. 2. The secondary common power source line 772 improves an electric characteristic of the common power source line 172, that is, the electrical resistance is decreased to suppress a voltage drop.

Next, referring to FIG. 2, an embodiment of the organic light emitting diode display 101 will be described in detail on the basis of the second thin film transistor 20, the organic light emitting element 70, and the capacitor 90 according to the deposition sequence thereof.

In some embodiments, the substrate 110 is formed as a transparent insulating substrate made of glass, quartz, ceramic, or plastic. When the substrate 110 is made of plastic, it can be formed to be a flexible substrate.

A buffer layer 120 is formed on the substrate 110. The buffer layer 120 is formed to be a single layer or multiple layers including at least one of a silicon oxide layer and a silicon nitride layer by using chemical vapor deposition or physical vapor deposition.

The buffer layer 120 prevents diffusion or penetration of moisture or impurities generated from the substrate 110, smoothes the surface, and controls the transmission speed of heat during a crystallization process for forming a semiconductor layer.

In some embodiments, the buffer layer 120 can be omitted depending on the type of substrate 110 and process conditions.

A semiconductor layer pattern including the active layer 136 and the first capacitor electrode 139 are formed on the buffer layer 120. The active layer 136 and the first capacitor electrode 139 are formed by depositing and crystallizing an amorphous silicon layer on the buffer layer 120 to form a polysilicon layer, and patterning the polysilicon layer. In other embodiments, the first capacitor electrode 139 may be formed of a different material from that of the active layer 136. For example, the first capacitor electrode 139 may be formed of a metal.

A gate insulating layer 140 is formed on the active layer 136 and the first capacitor electrode 139. The gate insulating layer 140 is formed to cover the active layer 136 and the first capacitor electrode 139 on the buffer layer 120. The gate insulating layer pattern 140 is formed inclusive of various insulating materials, such as, for example, tetraethyl orthosilicate (TEOS), silicon nitride (SiNx), and silicon oxide (SiO2).

A first conductive layer pattern including the gate electrode 156, the pixel electrode 710, and the second capacitor electrode 159 is formed on the gate insulating layer 140. Also, the first conductive layer pattern can further include a gate line 151 (see FIG. 1).

The gate electrode 156 is formed on the active layer 136 so as to overlap a channel region 1366 of the active layer 136. The semiconductor layer 136 is divided into the channel region 1366 that is not doped with an impurity, and a source region 1367 and a drain region 1368 disposed on respective sides of the channel region 1366 and doped with an impurity. The gate electrode 156 blocks the channel region 1366 from being doped with an impurity when the impurity is doped into the active layer 136 to form the source region 1367 and the drain region 1368. Furthermore, the impurity may be doped into the first capacitor electrode 139 when the impurity is doped into the source region 1367 and the drain region 1368 of the active layer 136.

The gate electrode 156 is formed in a double-layer structure including a gate transparent conductive layer and a gate metal layer formed on the gate transparent conductive layer. The gate metal layer includes at least one of various metallic materials such as molybdenum (Mo), chromium (Cr), aluminum (Al), silver (Ag), titanium (Ti), tantalum (Ta), and tungsten (W). The gate transparent conductive layer includes at least one of transparent conductive layers such as indium tin oxide (ITO), indium zinc oxide (IZO), zinc indium tin oxide (ZITO), gallium indium tin oxide (GITO), indium oxide (In2O3), zinc oxide (ZnO), gallium indium zinc oxide (GIZO), gallium zinc oxide (GZO), fluorine tin oxide (FTO), and aluminum-doped zinc oxide (AZO).

The pixel electrode 710 can be formed with the same material and the same layer as the gate transparent conductive layer of the gate electrode 156.

The second capacitor electrode 159 is disposed on the first capacitor electrode 139. The gate insulating layer 140 positioned between the first capacitor electrode 139 and the second capacitor electrode 159 functions as a dielectric material. The first capacitor electrode 139, the gate insulating layer 140, and the second capacitor electrode 159 form the capacitor 90.

The second capacitor electrode 159 may be formed with the same material and the same layer as the gate transparent conductive layer, like the pixel electrode 710.

In other embodiments, the second capacitor electrode 159 can be formed of the multi-layer structure including the gate transparent conductive layer and the gate metal layer, like the gate electrode 156. The second capacitor electrode 159 can be formed to the second conductive layer pattern that is described below, rather than the first conductive layer pattern.

An interlayer insulating layer 160 is formed on the first conductive layer patterns 151, 156, and 159. The interlayer insulating layer 160 includes at least one of a silicon nitride film and a silicon oxide film. The interlayer insulating layer 160 can be formed in a single layer structure including the silicon nitride film or silicon oxide layer, or in a multi-layer structure including both the silicon nitride film and the silicon oxide film. The interlayer insulating layer 160 can contain hydrogen. The silicon nitride film can contain hydrogen in terms of process conditions. The interlayer insulating layer 160 can execute a function of providing hydrogen to the semiconductor layers 133 and 136 during annealing of the semiconductor layers 133 and 136 to achieve smooth annealing, in addition to having an insulating function.

In other embodiments, the interlayer insulating layer 160 may use an organic film, rather than the inorganic layer such as the silicon nitride film and the silicon oxide film. When forming the organic film as the interlayer insulating layer 160, the first insulation layer 170 can be formed to be relatively thick. The interlayer insulating layer 160 can be formed to have a substantial thickness so as to acquire stable inter-layer insulation.

The interlayer insulating layer 160 may be formed with a plurality of layers all including the inorganic film and the organic film.

The interlayer insulating layer 160 has a pixel interlayer opening region 163 exposing a portion of the pixel electrode 710. The gate metal layer formed on the gate transparent conductive layer can be removed in the process of forming the pixel electrode 710 through the pixel interlayer opening region 163 of the interlayer insulating layer 160.

The interlayer insulating layer 160 has a capacitor opening region 169 formed on the second capacitor electrode 159. The gate metal layer formed on the gate transparent conductive layer can be removed in the process of forming the second capacitor electrode 159 through the capacitor opening region 169 of the interlayer insulating layer 160.

The interlayer insulating layer 160 and the gate insulating layer 140 have a plurality of contact holes 167 and 168 exposing a portion of the active layer 136. The plurality of contact holes 167 and 168 expose a portion of the source region 1367 and the drain region 1368 of the active layer 136.

The second conductive layer pattern, including the data line 171 (see FIG. 1), the common power source line 172, the source electrode 177, and the drain electrode 178, is formed on the interlayer insulating layer 160. In some embodiments, the second capacitor electrode 159 can be included in the second conductive layer pattern.

The second conductive layer pattern can include at least one of various metallic materials.

The source electrode 177 and the drain electrode 178 contact the source region 1367 and the drain region 1368 of the active layer 136 through the contact holes 167 and 168, respectively.

A protecting insulating layer 180 is formed on the second conductive layer patterns 171, 172, 176, and 178. The protecting insulating layer 180 can be formed of various materials.

The protecting insulating layer 180 has a pixel protecting opening region 183 exposing a portion of the pixel electrode 710 along with the pixel interlayer opening region 163 of the interlayer insulating layer 160. The protecting insulating layer 180 has a line opening region 188 exposing the common power source line 172.

A pixel defining layer 190 is formed on the protecting insulating layer 180. The pixel defining layer 190 includes a pixel opening 193 exposing a portion of the pixel electrode 710 along with the pixel protecting opening region 183 of the protecting insulating layer 180 and the pixel interlayer opening region 163 of the interlayer insulating layer 160, and a line opening 198 exposing the common power source line 172 along with the line opening region 188 of the protecting insulating layer 180.

The pixel defining layer 190 can be formed of various organic or inorganic materials. For example, the pixel defining layer 190 can be formed through thermal hardening or photohardening after patterning a photosensitive organic layer.

The organic emission layer 720 is formed on the pixel electrode 710 in the pixel opening 193 of the pixel defining layer 190.

The common electrode line 730 is formed on the organic emission layer 720 and is parallel to the data line 171 and the common power source line 172. The common electrode line 730 is disposed to not overlap the first capacitor electrode 139 and the second capacitor electrode 159.

The pixel electrode 710, the organic emission layer 720, and the common electrode line 730 form the organic light emitting diode 70. The pixel opening 193 of the pixel defining layer 190 where the pixel electrode 710, the organic emission layer 720, and the common electrode line 730 are sequentially deposited forms a light emitting region where the organic light emitting diode 70 emits light.

The secondary common power source line 772 is formed on the common power source line 172 according to the common power source line 172. The secondary common power source line 772 is disposed inside the line opening region 198 of the pixel defining layer 190 and the line opening region 188 of the protecting insulating layer 180. The secondary common power source line 772 is formed with the same material as the common electrode line 730. The secondary common power source line 772 can be formed parallel to the common electrode line 730.

As described above, in the embodiment of FIG. 1, the secondary common power source line 772 is formed to directly contact the common power source line 172.

By the above-described constitution, in one embodiment of the organic light emitting diode (OLED) display 101, the common electrode line 730 and the capacitor 90 do not overlap such that generation of unnecessary parasitic capacitance is minimized. Also, the voltage drop is suppressed by the secondary common power source line 772.

Next, referring to FIG. 3 to FIG. 7, an embodiment of a manufacturing method of the organic light emitting diode (OLED) display 101 will be described.

Figure 3:
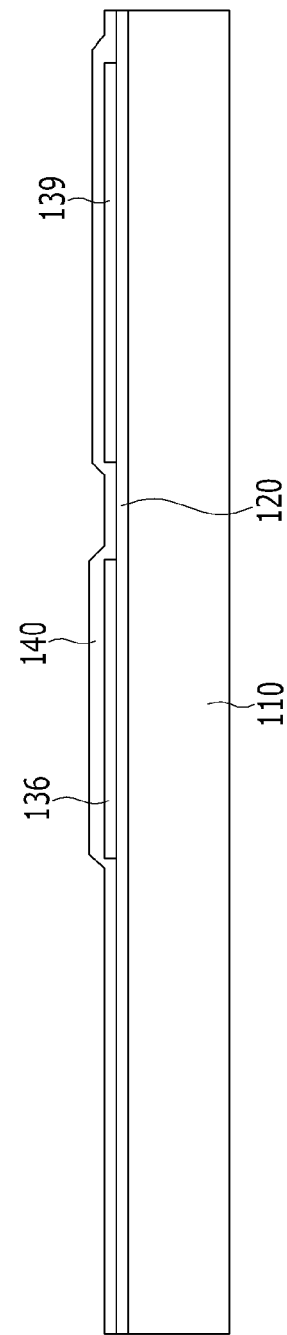
FIG. 3 to FIG. 7 are cross-sectional views sequentially showing an embodiment of a manufacturing process of the organic light emitting diode (OLED) display of FIG. 2.

Firstly, as shown in FIG. 3, a transparent insulating substrate 110 made of glass, quartz, ceramic, or plastic is provided, and a buffer layer 120 is formed on the substrate 110. The buffer layer 120 can be as a single-layered structure based on silicon nitride (SiNx), or a double-layered structure based on silicon nitride (SiNx) and silicon oxide (SiO2).

Next, a semiconductor layer pattern including an active layer 136 and a first capacitor electrode 139 is formed on the buffer layer 120. The semiconductor layer pattern (136 and 139) can be formed by depositing amorphous silicon on the buffer layer 120, crystallizing the amorphous silicon layer to form a polysilicon layer, and patterning the polysilicon layer.

The amorphous silicon layer is crystallized using one of various crystallization methods including solid phase crystallization, excimer laser crystallization, metal induced crystallization (MIC), metal induced lateral crystallization (MILC), and super grain silicon (SGS) crystallization.

Next, a gate insulating layer 140 covering the semiconductor layer patterns 136 and 139 is formed. Also, a gate transparent conductive layer and a gate metal layer are sequentially deposited on the gate insulating layer 140.

Figure 4:
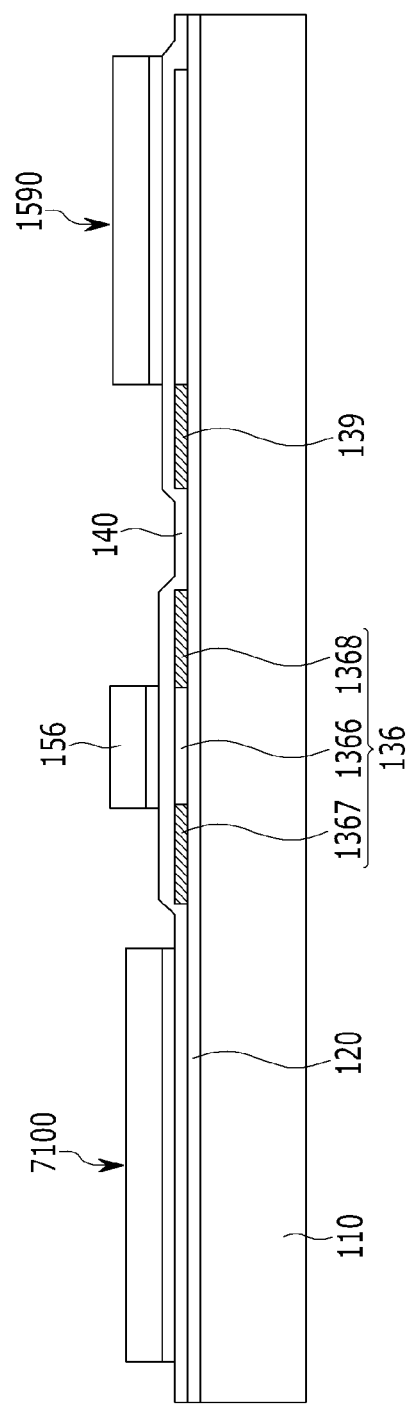

Next, as shown in FIG. 4, the gate transparent conductive layer and the gate metal layer are patterned to form a gate electrode 156, a pixel electrode intermediate member 7100, and a second capacitor electrode intermediate member 1590. The gate electrode 156, the pixel electrode intermediate member 7100, and the second capacitor electrode intermediate member 1590 are formed with a multi-layer structure in which the gate transparent conductive layer and the gate metal layer are sequentially deposited.

Next, the active layer 136 is doped with an impurity. The active layer 136 is divided into a channel region 1366 where the impurity is not doped, and source regions 1367 and drain regions 1368 where the impurity is doped. The gate electrode 156 prevents the impurity from being doped to the channel region 1366 of the active layer 136. A portion of the first capacitor electrode 139 is also doped with the impurity.

Figure 5:
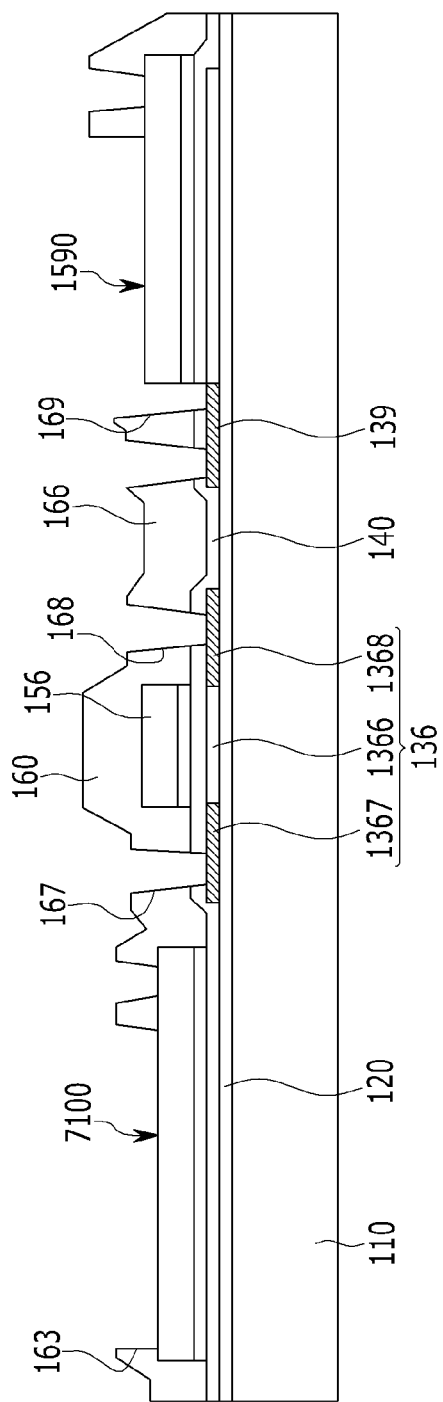

Next, as shown in FIG. 5, an interlayer insulating layer 160 is formed on the gate electrode 156, a pixel electrode intermediate member 7100, and a second capacitor electrode intermediate member 1590. The interlayer insulating layer 160 can be made of the inorganic layer including at least one of the silicon nitride layer and the silicon oxide or the organic layer. Also, the interlayer insulating layer 160 can include the inorganic layer and the organic layer.

Next, a plurality of contact holes 167 and 168 are formed in the interlayer insulating layer 160. The gate insulating layer 140 is also partially removed to expose the source region 1367 and the drain region 1368 of the active layer 136 through the contact holes 167 and 168 of the interlayer insulating layer 160.

Also, a pixel interlayer opening region 163 and a capacitor opening region 169 exposing the pixel electrode intermediate member 7100 and the second capacitor electrode intermediate member 1590 are formed in the interlayer insulating layer 160.

In FIG. 5, the capacitor opening region 169 completely exposes the second capacitor electrode intermediate member 1590. In other embodiments, the capacitor opening region 169 may be equal to or smaller than the second capacitor electrode intermediate member 1590.

Figure 6:
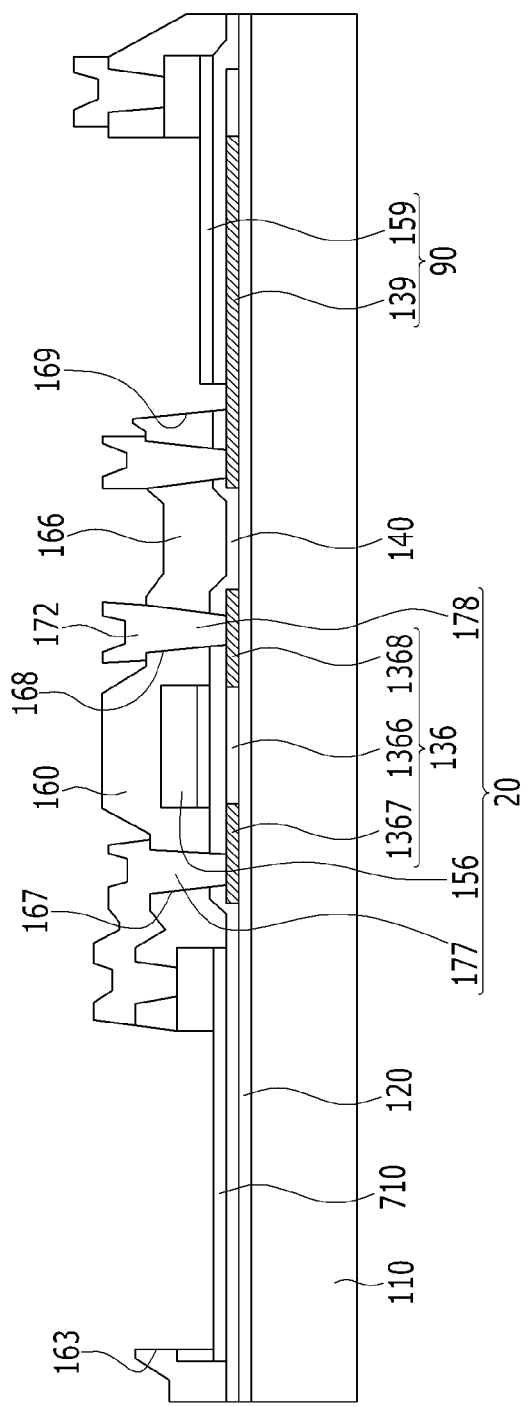

Next, as shown in FIG. 6, the gate metal layer of the pixel electrode intermediate member 7100 and the second capacitor electrode intermediate member 1590 exposed through the pixel interlayer opening region 163 and the capacitor opening region 169 is removed to complete the pixel electrode 710 and the second capacitor electrode 159.

Also, the other portion of the first capacitor electrode 139 is doped with the impurity. The second capacitor electrode 159 is formed with the gate transparent conductive layer such that the impurity can be passed through the second capacitor electrode 159 and can be doped to the first capacitor electrode 139.

Next, on the interlayer insulating layer 160, the second conductive layer pattern including a source electrode 177, a drain electrode 178, a data line (171, shown in FIG. 1), and a common power source line 172 is formed. The source electrode 177 and the drain electrode 178 contact the source region 1367 and the drain region 1368 of the active layer 136 through a plurality of contact holes 167 and 168.

Figure 7:
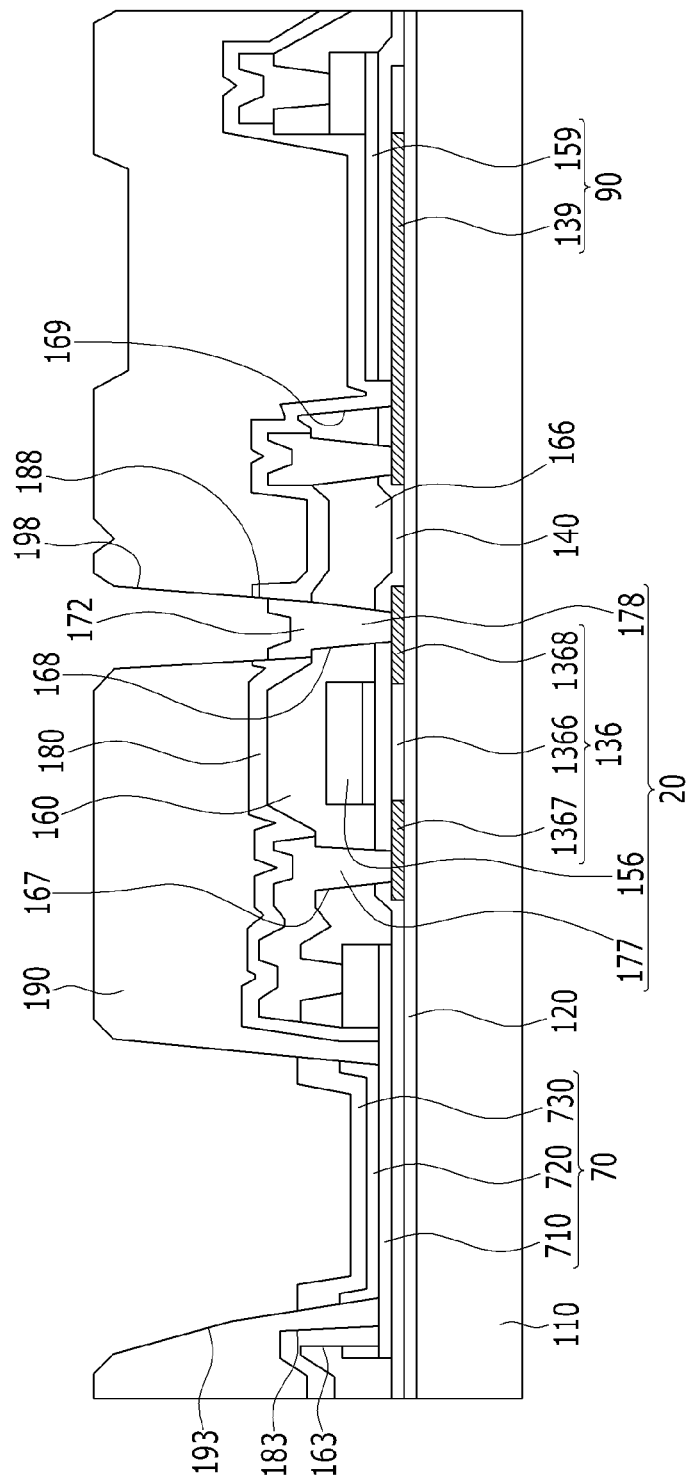

Next, as shown in FIG. 7, a protecting insulating layer 180 is formed on the second conductive layer pattern. The protecting insulating layer 180 has a pixel protecting opening region 183 exposing a portion of the pixel electrode 710 and a line opening region 188 exposing the common power source line 172 along with the pixel interlayer opening region 163 of the interlayer insulating layer 160.

Next, a pixel defining layer 190 is formed on the protecting insulating layer 180. The pixel defining layer 190 has a pixel opening 193 exposing a portion of the pixel electrode 710 along with the pixel interlayer opening region 163 of the interlayer insulating layer 160 and the pixel protecting opening region 183 of the protecting insulating layer 180, and a line opening 198 exposing the common power source line 172 along with the line opening region 188 of the protecting insulating layer 180.

Next, an organic emission layer is formed on the pixel electrode 710 exposed through the pixel opening 193 of the pixel defining layer 190.

Figure 2:
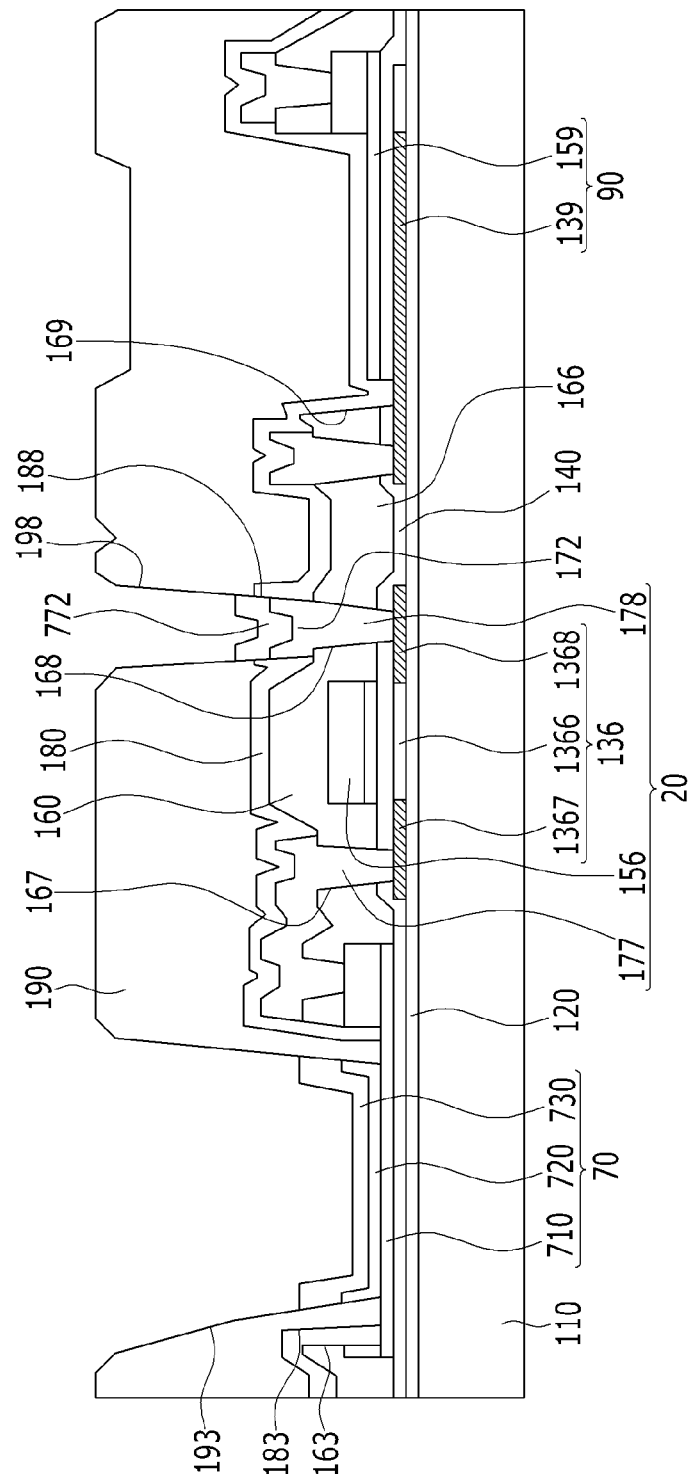
FIG. 2 is an enlarged cross-sectional view of the thin film transistor, the capacitor, and the organic light emitting element of FIG. 1.

Next, as previously as shown in FIG. 2, a common electrode line 730 is formed on an organic emission layer 720 and a secondary common power source line 772 is formed on the common power source line 172 exposed through the line opening 198 of the pixel defining layer 190. The common electrode line 730 and the secondary common power source line 772 are formed together with the same material. The secondary common power source line 772 improves an electrical characteristic of the common power source line 172 so as to suppress the voltage drop of the organic light emitting diode (OLED) display 101.

Through the above-described manufacturing method, the organic display device 101 can be manufactured. Accordingly, the organic light emitting diode (OLED) display 101 can have minimized generation of unnecessary parasitic capacitance and can suppress the voltage drop.

Next, another embodiment of a display device 102 will be described with reference to FIG. 8.

Figure 8:
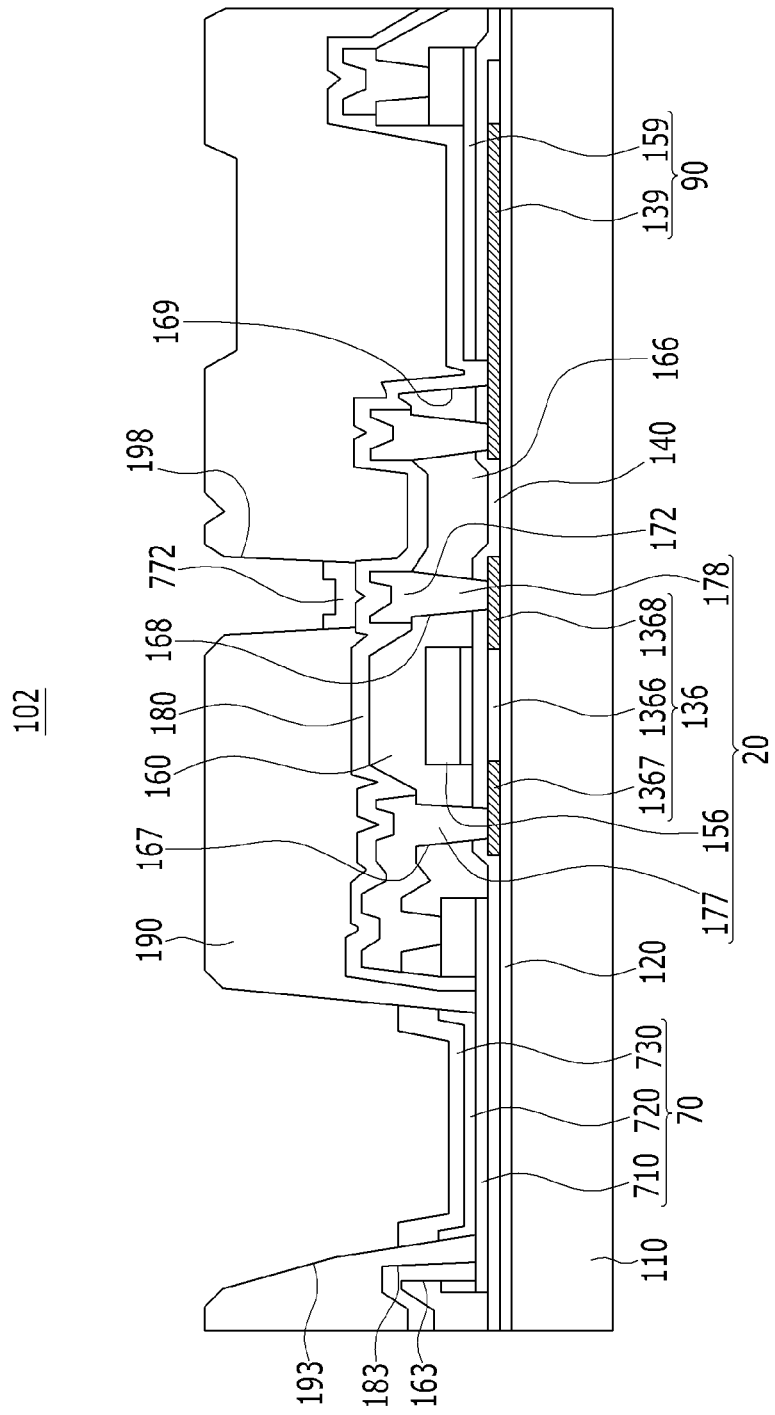
FIG. 8 is an enlarged cross-sectional view of another embodiment of an organic light emitting diode (OLED) display.

As shown in FIG. 8, in the organic light emitting diode (OLED) display 102, a secondary common power source line 772 is formed on a common power source line 172 via a protecting insulating layer 180. The protecting insulating layer 180 does not have the line opening region.

The secondary common power source line 772 and the common power source line 172 disposed via the protecting insulating layer 180 therebetween may be used as a secondary capacitor of a metal-insulator-metal (MIM) structure.

By this constitution, in the organic light emitting diode (OLED) display 102, the common electrode line 730 and the capacitor 90 do not overlap each other such that the generation of the unnecessary parasitic capacitance is minimized. Also, the common power source line 172 and the secondary common power source line 772 can be used as the secondary capacitor.

Further, the manufacturing method of the organic light emitting diode (OLED) display 102 is the same as the embodiment of FIG. 1, except that the line opening region is not formed in the protecting insulating layer 180.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

| Description of Symbols | |
|---|---|
| 10, 20: thin film transistor | 70: organic light emitting element |
| 90: capacitor | 101, 102: display device |
| 110: substrate | 120: buffer layer |
| 136: active layer | 139: first capacitor electrode |
| 140: gate insulating layer | 151: gate line |
| 156: gate electrode | 159: second capacitor electrode |
| 160: interlayer insulating layer | 171: data line |
| 172: common power source line | 177: source electrode |
| 178: drain electrode | 180: protecting insulating layer |
| 190: pixel defining layer | 710: pixel electrode |
| 720: organic emission layer | 730: common electrode line |
| 772: secondary common power source line | |
| PE: pixel area | |

What is claimed is:

1. An organic light emitting diode (OLED) display comprising:
 a substrate;
 a first thin film transistor and a second thin film transistor both disposed on the substrate and both having an active layer, a gate electrode, a source electrode, and a drain electrode;
 a gate line connected to the gate electrode of the first thin film transistor;
 a data line connected to the source electrode of the first thin film transistor and intersecting the gate line;
 a common power source line connected to the source electrode of the second thin film transistor, intersecting the gate line, and parallel to the data line;
 a pixel electrode connected to the drain electrode of the second thin film transistor;
 an organic emission layer disposed on the pixel electrode;
 a common electrode line disposed on the organic emission layer and parallel to the data line and the common power source line;
 a secondary common power source line formed with the same material as and parallel to the common electrode line and disposed on the common power source line; and
 a capacitor disposed between the common electrode line and the secondary common power source line, wherein the common electrode line and the capacitor do not overlap in a top view.

2. The organic light emitting diode (OLED) display of claim 1, wherein:
 the capacitor comprises:
  a first capacitor electrode formed with the same layer as the active layer of the first thin film transistor and the second thin film transistor and connected to the drain electrode of the first thin film transistor and the gate electrode of the second thin film transistor; and
  a second capacitor electrode formed with the same layer as the pixel electrode and the gate electrode and connected to the source electrode of the second thin film transistor and the common power source line.

3. The organic light emitting diode (OLED) display of claim 1, wherein the secondary common power source line is formed directly on the common power source line.

4. The organic light emitting diode (OLED) display of claim 1, further comprising a protecting insulating layer disposed between the secondary common power source line and the common power source line.

5. An organic light emitting diode (OLED) display comprising:
 a substrate;
 a semiconductor layer pattern formed on the substrate and including an active layer and a first capacitor electrode;
 a gate insulating layer formed on the semiconductor layer pattern;
 a first conductive layer pattern disposed on the gate insulating layer and including a gate line, a pixel electrode, a gate electrode, and a second capacitor electrode;
 an interlayer insulating layer disposed on the first conductive layer pattern and having a pixel interlayer opening region exposing a portion of the pixel electrode;
 a second conductive layer pattern including a source electrode, a drain electrode, a data line, and a common power source line disposed on the interlayer insulating layer;
 a protecting insulating layer disposed on the second conductive layer pattern and having a pixel protecting opening region exposing a portion of the pixel electrode;
 a pixel defining layer disposed on the protecting insulating layer and having a pixel opening exposing a portion of the pixel electrode along with the pixel interlayer opening region and the pixel protecting opening region, and a line opening disposed on the common power source line;
 an organic emission layer disposed on the pixel electrode exposed through the pixel opening of the pixel defining layer;
 a common electrode line disposed on the organic emission layer and not overlapping with either a first capacitor electrode or a second capacitor electrode;
 a secondary common power source line disposed along the common power source line in the line opening of the pixel defining layer; and
 a capacitor disposed between the common electrode line and the secondary common power source line, wherein the common electrode line and the capacitor do not overlap in a top view.

6. The organic light emitting diode (OLED) display of claim 5, wherein the secondary common power source line is formed on the common power source line via the protecting insulating layer.

7. The organic light emitting diode (OLED) display of claim 5, wherein the protecting insulating layer further includes a line opening region exposing the common power source line along with the line opening of the pixel defining layer.

8. The organic light emitting diode (OLED) display of claim 7, wherein the secondary common power source line is disposed directly on the common power source line.

9. The organic light emitting diode (OLED) display of claim 5, wherein the common electrode line intersects the gate line and is parallel to the data line and the common power source line.

10. A method of manufacturing an organic light emitting diode (OLED) display, comprising:
 providing a substrate;
 forming a semiconductor layer pattern including an active layer and a first capacitor electrode on the substrate;
 forming a gate insulating layer on the semiconductor layer pattern;
 forming a first conductive layer pattern including a gate line, a pixel electrode, a gate electrode, and a second capacitor electrode on the gate electrode;
 forming an interlayer insulating layer having a pixel interlayer opening region exposing a portion of the pixel electrode on the first conductive layer pattern;
 forming a second conductive layer pattern including a source electrode, a drain electrode, a data line, and a common power source line on the interlayer insulating layer;

forming a protecting insulating layer having a pixel protecting opening region exposing a portion of the pixel electrode along with the pixel interlayer opening region on the second conductive layer pattern;

forming a pixel defining layer having a pixel opening exposing a portion of the pixel electrode along with the pixel interlayer opening region and the pixel protecting opening region, and a line opening formed on the common power source line on the protecting insulating layer;

forming an organic emission layer on the pixel electrode exposed through the pixel opening of the pixel defining layer;

forming a common electrode line that does not overlap a first capacitor electrode and a second capacitor electrode on the organic emission layer in a top view;

forming a secondary common power source line according to the common power source line in the line opening of the pixel defining layer.

11. The method of claim 10, wherein the secondary common power source line is formed on the common power source line via the protecting insulating layer.

12. The method of claim 10, wherein the protecting insulating layer further includes a line opening region exposing the common power source line along with the line opening of the pixel defining layer.

13. The method of claim 12, wherein the secondary common power source line is formed directly on the common power source line.

14. The method of claim 10, wherein the common electrode line intersects the gate line and is parallel to the data line and the common power source line.

* * * * *